United States Patent [19]

Minogue

[11] Patent Number: 4,684,922

[45] Date of Patent: Aug. 4, 1987

[54] TEMPORAL AVERAGING USING A VOLTAGE MODE D/A CONVERTER

[75] Inventor: Paschal Minogue, Nenagh, Ireland

[73] Assignee: Analog Devices, Inc., Norwood, Mass.

[21] Appl. No.: 931,910

[22] Filed: Nov. 17, 1986

Related U.S. Application Data

[63] Continuation of Ser. No. 819,244, Jan. 15, 1986, abandoned.

[51] Int. Cl.⁴ .............................................. H03M 1/66
[52] U.S. Cl. ............................ 340/347 DA; 364/575; 364/572; 364/606
[58] Field of Search ................................ 340/347 DA; 364/600–606, 572, 575, 811

[56] References Cited

U.S. PATENT DOCUMENTS 3,728,719  4/1973  Fish ............................ 340/347 DA
3,789,199  1/1974  Kotwicki ........................... 364/602
4,350,974  9/1982  Gordon ....................... 340/347 DA Primary Examiner—Charles D. Miller
Attorney, Agent, or Firm—Wolf, Greenfield & Sacks

[57] ABSTRACT

A digitally programmable infinite impulse response (IIR) filter particularly useful as a temporal averager. The filter comprises a voltage mode multiplying digital-/analog converter (12) and two sample-and-hold circuits (10, 16). The first sample-and-hold circuit receives the input signal to the system and supplies its output signal to the reference voltage input terminal of the DAC. The second sample and hold circuit has its input terminal connected to the voltage output terminal of the DAC and has its output connected to the analog ground terminal of the DAC. A digital input code (D) supplied to the DAC controls its gain and the degree of noise rejection provided by the filter, by altering the frequency response of the filter.

4 Claims, 14 Drawing Figures

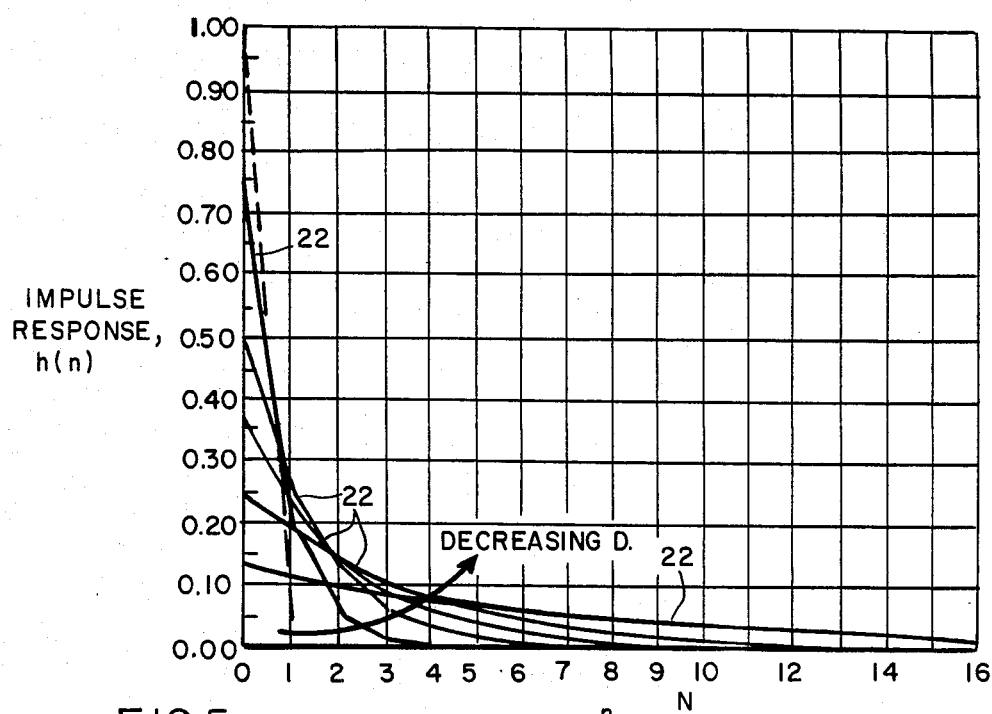
FIG. 5  $h(n) = (1-D)^n D$
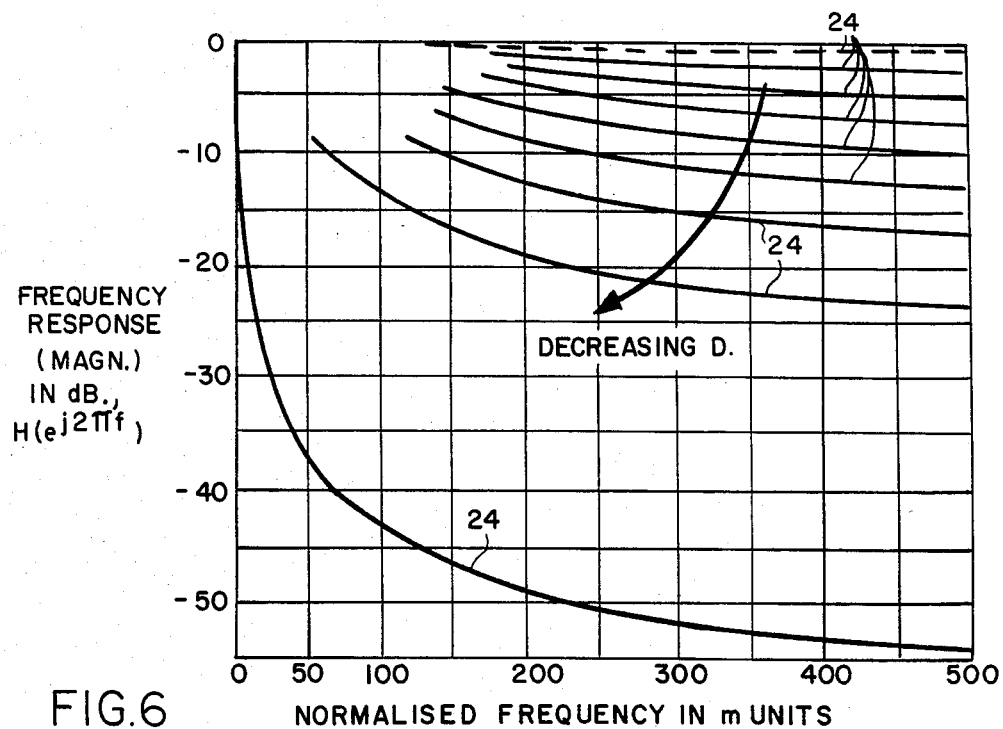
FIG. 6

TEMPORAL AVERAGING USING A VOLTAGE MODE D/A CONVERTER

This application is a continuation of application Ser. No. 819,244, filed Jan. 15, 1986, now abandoned.

FIELD OF THE INVENTION

This invention relates to the fields of digital filtering in general, particularly adaptive filtering, and more specifically to noise filtering by temporal averaging.

BACKGROUND OF THE INVENTION

Digital signal processing is a broad field encompassing those operations which are done by and with digital logic circuitry and computers to condition or extract meaning from signals acquired from physical sensors or sources. Various specialized techniques using high performance circuits and programs are employed to enable signals to be processed numerically at high speeds. One class of digital signal processing circuits is digital filters. Digital filters are used for exactly the same purpose as analog filters—i.e., to pass signals in certain frequency bands and to attenuate signals in other frequency bands. Modern digital filtering is carried out by performing in time domain the successive multiplications and additions required to perform convolution, corresponding to multiplication in the frequency domain.

One well-known application of digital filtering techniques is "temporal averaging." Temporal averaging is an accepted method of reducing the noise in a picture or other waveform. It is accomplished by adding successive frames of an image or samples of a waveform. Weighted averaging often is employed, with one frequent approach being so-called exponential smoothing. Temporal averaging has heretofore been implemented using either discrete multiplier/accumulator integrated circuits together with appropriate analog-to-digital and digital-to-analog converters, or by using potentiometers. The latter approach requires manual adjustment of the potentiometers and introduces temperature dependency, potentiometer noise and other undesirable factors. The former approach requires the use of several integrated circuits, with attendant expenses. A good example of such a prior art multiplier/accumulator exponential smoothing system is shown in *Analog Devices Data-Acquisition Databook* 1984, Volume 1: *Integrated Circuits*, at page 12-12 (Analog Devices, Inc., Norwood, Mass. USA 1984).

It is therefore an object of the present invention to provide an improved adaptive digital filter suitable for use in temporal averaging.

Another object of the invention is to provide a digital temporal averaging circuit which uses fewer components than multiplier/accumulator designs.

It is a further object of the invention to provide a temporal averaging circuit based upon a standard voltage mode digital-to-analog converter.

Yet another object of the invention is to provide a less expensive digital filter for use in temporal averaging.

SUMMARY OF THE INVENTION

These objects are achieved in the present invention by a circuit which uses a single voltage mode digital-to-analog converter (DAC) and two sample-and-hold (S/H) circuits. The DAC is used as a so-called "multiplying" DAC; that is, it provides as its analog output a scaled (i.e., multiplied) version of its analog input, with a DC offset. The multiplication factor, or gain, is less than 1, so the multiplying DAC is really a programmable attenuator.

The noisy input signal is provided to the output of a first one of the S/H circuits and the input of that S/H circuit is provided to the analog reference input terminal of the DAC. The analog output voltage of the DAC is supplied to the input of a second S/H circuit whose output is then connected to the analog ground terminal of the DAC. The output of the DAC thus becomes a weighted sum of the current, noisy input sample and the DAC's output for the previous input sample. The weighting is variable in accordance with the digital gain-controlling code supplied to the DAC. The weighted-sum averaging tends to attenuate the noise component of the input, much like a low-pass filter does.

The previously discussed objects, features and advantages of this configuration will best be understood by reference to the following more detailed discussion of an illustrative embodiment, which should be read in conjunction with the accompanying drawing.

BRIEF DESCRIPTION OF THE DRAWING

In the drawing,

FIG. 5 is a graph showing a simulation of the impulse response of the temporal averager of FIG. 4, for various values of the parameter D (the digital code), from $D=1/256$ to $D=249/256$, as a function of n (sampling intervals);

FIG. 6 is a series of graphs showing the calculated, or simulated, frequency response magnitude of the temporal averager of FIG. 4, as a function of the parameter D, the digital code;

DETAILED DESCRIPTION OF AN ILLUSTRATIVE EMBODIMENT

In general, a discrete-time linear system may be represented by a difference equation:

$$y(n) = \sum_{k=o}^{N-1} a(k)x(n-k) + \sum_{l=1}^{M} b(l)y(n-l)$$

where x is the system input, y is the system output and the coefficients a(k) and b(l) determine the system transfer function. When all the coefficients b(l) are 0, the system output depends only on the current system input(s). That is, $$y(n) = \sum_{k=o}^{N-1} a(k)x(n-k).$$

That equation, known as the convolution sum, models a non-recursive system. Such a system may be implemented by means of a transversal filter structure. The coefficients a(k) are actually the non-zero elements of the impulse response sequence h(n), where $$h(n) = \begin{cases} a(n) & o \leq n \leq (N-1) \\ 0 & \text{elsewhere} \end{cases}$$

This is said to be a finite impulse response (FIR) filter.

By contrast, if the coefficients b(l) are non-zero, then the system output depends not only on the current system input(s) but also on previous system output(s). This is referred to as the recursive difference equation. The first order version of this recursive case is:

$$y(n) = ax(n) + by(n-1).$$

A recursive system generally has an infinite impulse response (IIR). This first order recursive system forms the basis of the temporal averager which is discussed below.

Figure 1:
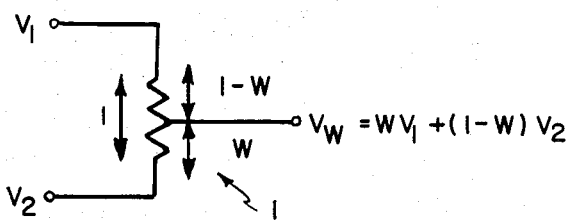
FIG. 1 is a schematic diagram of a potentiometer circuit exhibiting a transfer function of the form indicated thereon.

Temporal averaging is a scheme for reducing noise in a signal by implementing a special first order difference equation:

$$\hat{x}_t = \alpha x_t + (1-\alpha)\hat{x}_{t-1}$$

where $x_t$ is the current noisy input sample, $\hat{x}_{t-1}$ is the smoothed output sample for the immediately preceeding noisy input sample, $\hat{x}_t$ is the smoothed output sample for the present noisy input sample and $\alpha$ and $(1-\alpha)$ are weighting coefficients which determine the noise reduction factor. This first order system function has the same form as the transfer function for the simple potentiometer circuit of FIG. 1. That is, when w represents the fractional part of the total potentiometer resistance R between the lower potentiometer terminal (connected to voltage $V_2$) and the wiper (which provides the output voltage $V_W$), $V_W = W*V_1 + (1-W)*V_2$, where $V_1$ and $V_2$ are the voltages on the respective end terminals of the potentiometer and W and $(1-W)$ are the fractional distances of the wiper (in terms of resistances) on the lower and upper terminals of the potentiometer, respectively.

Figure 2:
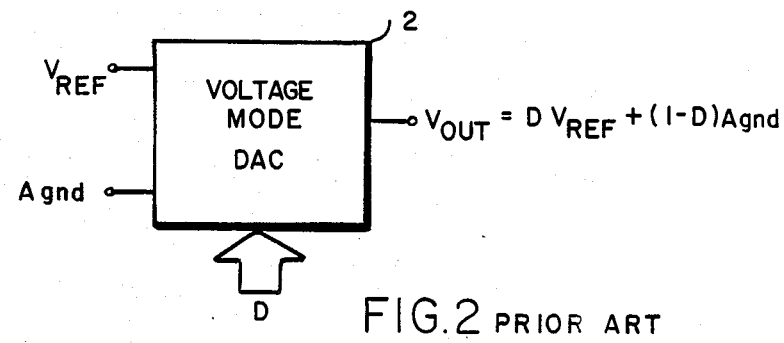
FIG. 2 is a block diagram illustration of a voltage-mode multiplying digital-to-analog converter (DAC) which is used in the present invention.
Figure 3:
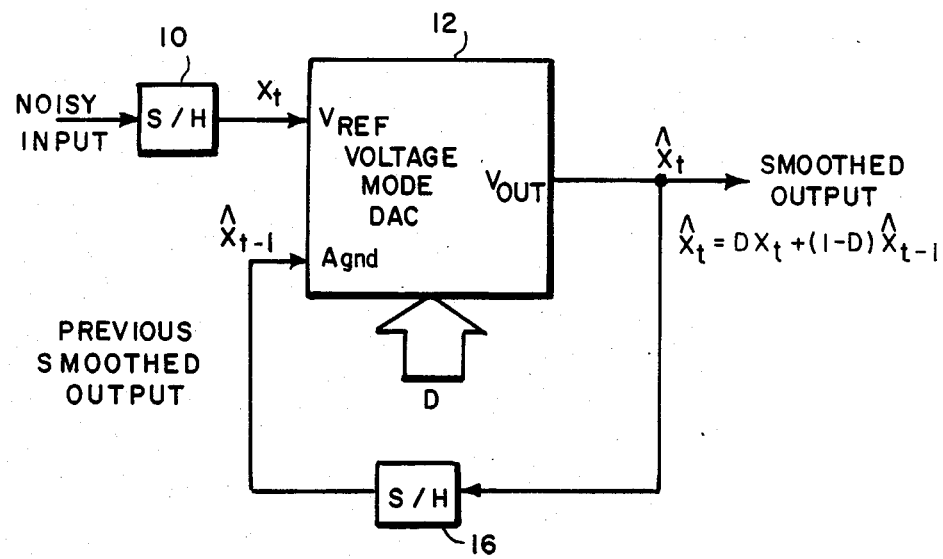
FIG. 3 is a simple block diagram of the temporal averager of the present invention.

Interestingly, the transfer function of a voltage mode DAC 2 (see FIG. 2) takes on the same form; $V_{OUT} = D \cdot V_{REF} + (1-D)A_{gnd}$, where $V_{REF}$ is the voltage at the reference terminal of the DAC, $A_{gnd}$ is the voltage at the analog ground terminal of the DAC, $V_{OUT}$ is the output voltage of the DAC and D is the fractional representation of the digital code (i.e., the gain of the DAC). Due to this identity of form of transfer functions, temporal averages and other digitally programmable infinite impulse response filters can be implemented using voltage mode DAC's. For example, to implement the temporal averager, the present, noisy sample can provide the $V_{REF}$ voltage, the previous smoothed sample can provide the $A_{gnd}$ input and the present smoothed sample will appear as the output. The resulting circuit is shown in FIG. 3. There, the noisy input signal is applied to a first sample and hold circuit 10. The output of S/H circuit 10 is connected to the $V_{REF}$ input of DAC 12. The $V_{OUT}$ terminal of DAC 12 not only supplies the smoothed output signal but also is connected to the input of a second S/H circuit 16. The output of S/H 16 is provided to the $A_{gnd}$ input terminal of DAC 12.

Figure 4:
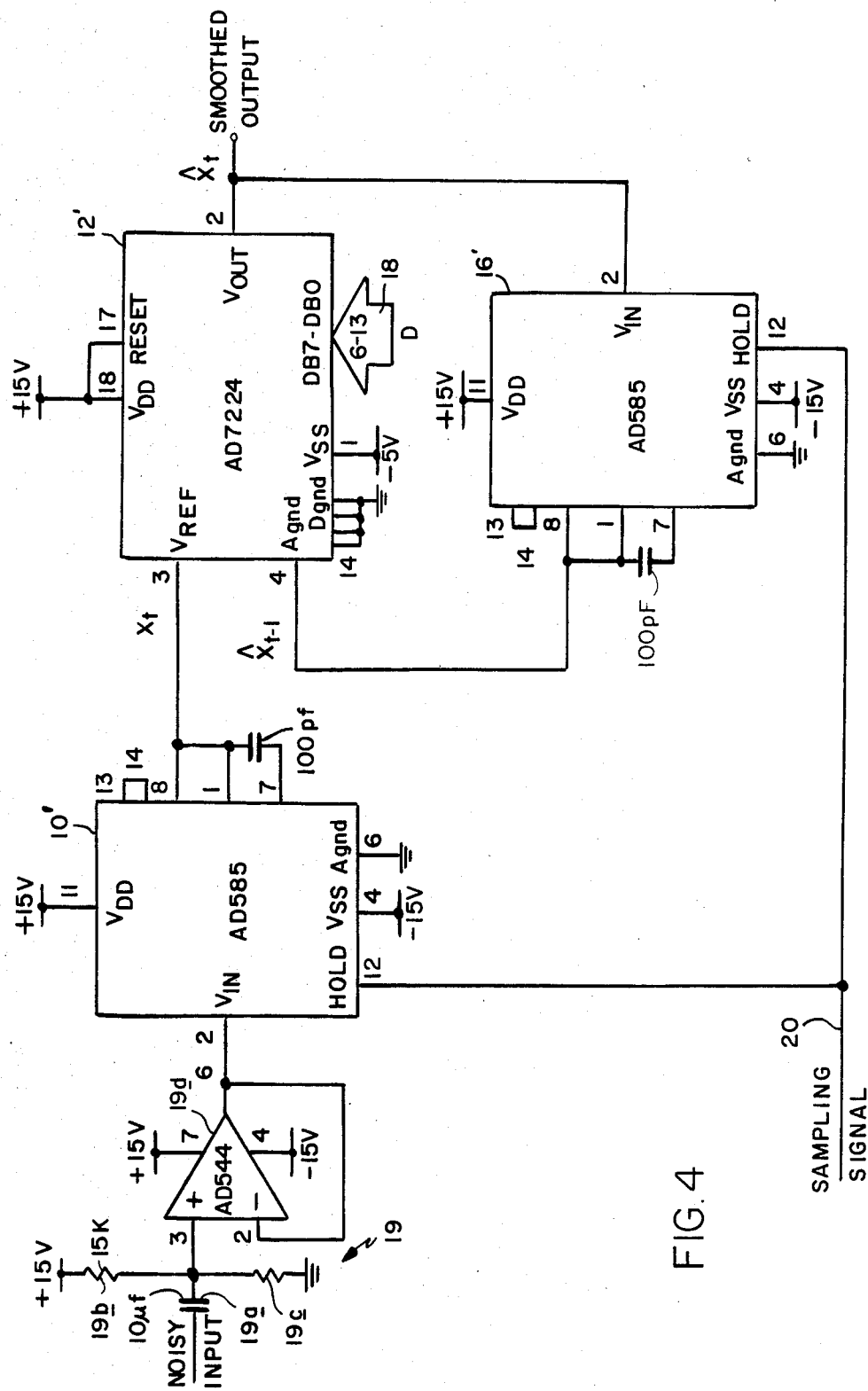
FIG. 4 is a detailed circuit schematic diagram for the temporal averager of FIG. 3.

A detailed schematic diagram, corresponding to the block diagram of FIG. 3, is provided in FIG. 4. There, the S/H circuits 10' and 16' are implemented using Analog Devices type AD585 sample and hold circuits and the voltage mode DAC 12' is implemented using an Analog Devices type AD7224 DAC. An input buffer circuit 19 has been added between the input terminal and the voltage input terminal of S/H circuit 10'. The buffer 19 comprises a coupling capacitor at 19a, a pair of resistors 19b and 19c, and a buffer amplifier 19d, which may, as indicated, be an Analog Devices type AD544 operational amplifier. The sampling signal which drives S/H circuits 10' and 16' is applied on line 20 from an external source of clocking (i.e., sampling) pulses (not shown). Suitable pin connections are indicated using the examplary components. The digital code which controls the gain of the DAC 12' is applied at 18.

An examination of the properties of the voltage mode DAC used as an adaptive filter requires consideration of both its impulse response and its frequency response. If x(n) is an impulse at n and y(−1)=0, then the successive outputs are given by Y(0)=D; Y(1)=(1−D)*D; Y(2)=(1−D)$^2$*D ... y(n)=(1−D)$^N$D, which is thus the impulse response h(n). The impulse response is thus guaranteed to be stable if the gain factor D is less than 1, which it must be.

The magnitude of the frequency response may be found to be approximately as follows:

$$|H(e^{j2\pi f})| = \frac{D}{\sqrt{1 - 2(1-D)\cos 2\pi f + (1-D)^2}}$$

where f is the frequency normalized to the sampling frequency; and the phase of the transfer function may be found to be:

$$\angle H(e^{j2\pi f}) = \tan^{-1}\left[\frac{(1-D)\sin 2\pi f}{(1-D)\cos 2\pi f - 1}\right].$$

The normalized breakpoint, or 3 dB frequency, as a function of the factor D can be calculated to be $$f_{3dB} = \frac{1}{2\pi} \cos^{-1}\left[2 - \frac{1}{2}\left((1-D) + \frac{1}{(1-D)}\right)\right].$$

Essentially, the temporal averager exhibits the frequency response of a digitally programmable low-pass filter.

Figure 7:
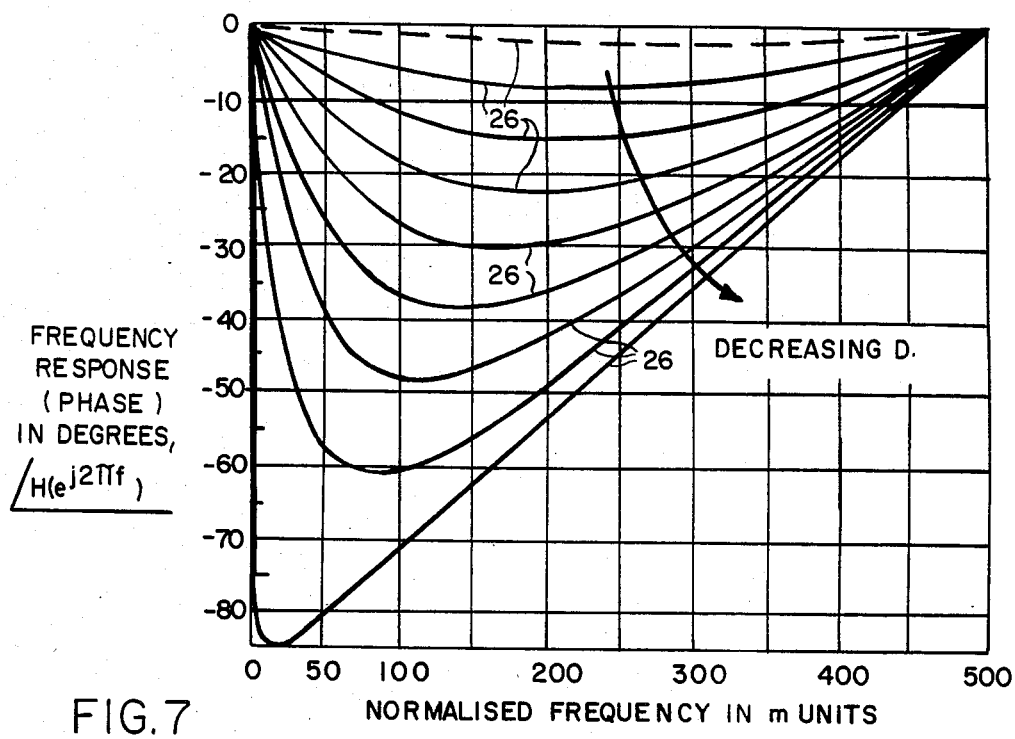
FIG. 7 is a series of graphs showing the phase of the transfer function of the temporal averager of FIG. 4, as a function of the parameter D.
Figure 8:
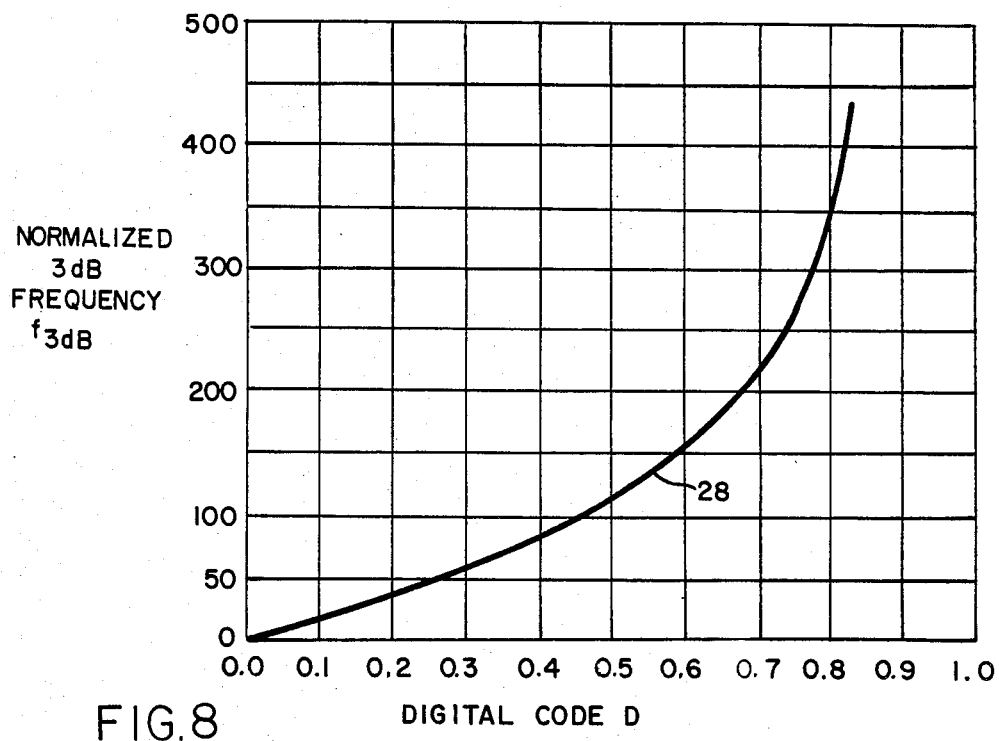
FIG. 8 is a graph showing how the 3-dB frequency of the temporal averager of FIG. 4 varies with the digital code, D.
Figure 9:
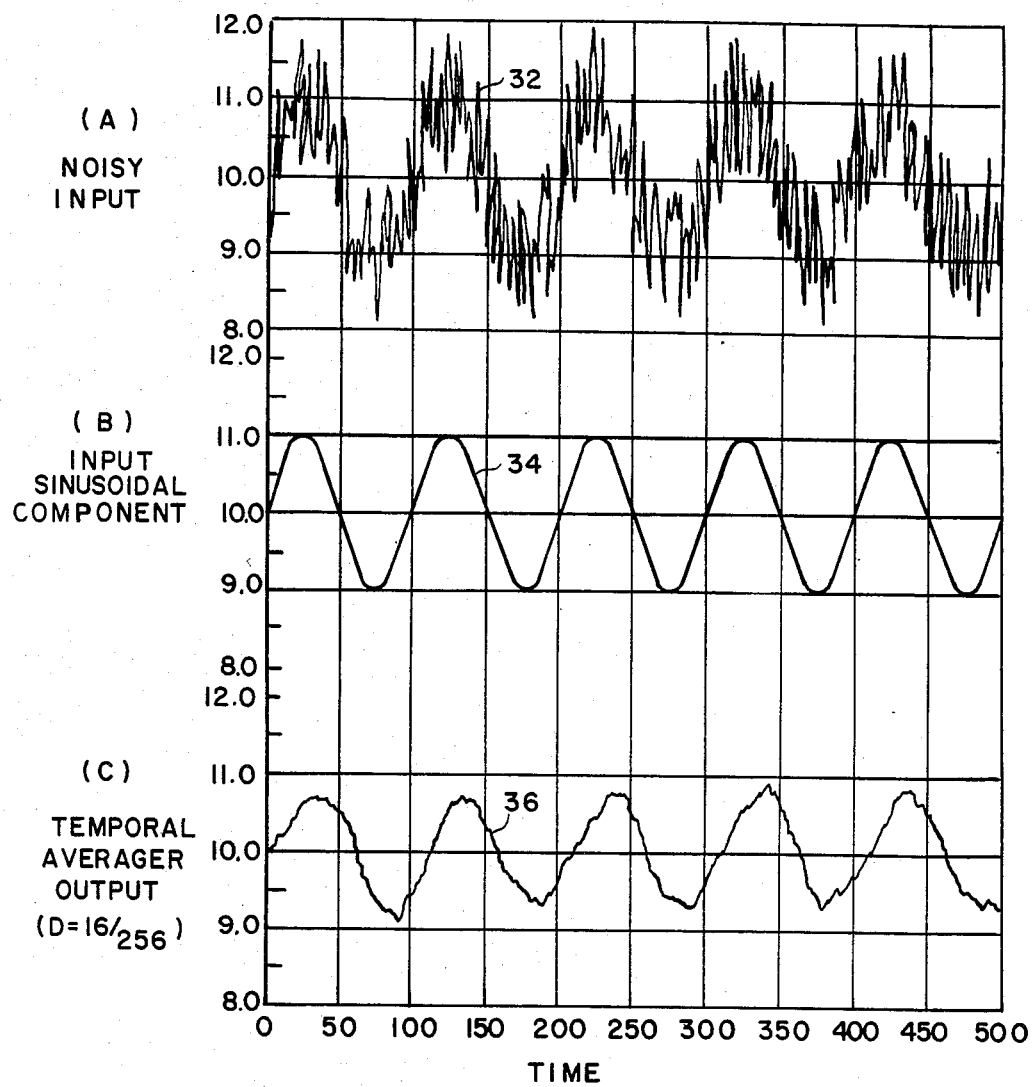
FIG. 9(A) is a graph of the amplitude of the noisy input of a test signal to the temporal averager, as a function of time.
FIG. 9(B) is a graph of the amplitude of the sinusoidal component of the input signal of FIG. 9(A)
FIG. 9(C) is a graph of the output of the temporal averager of FIG. 4 as simulated with the digital code D fixed at a value of 16/256.
Figure 10:
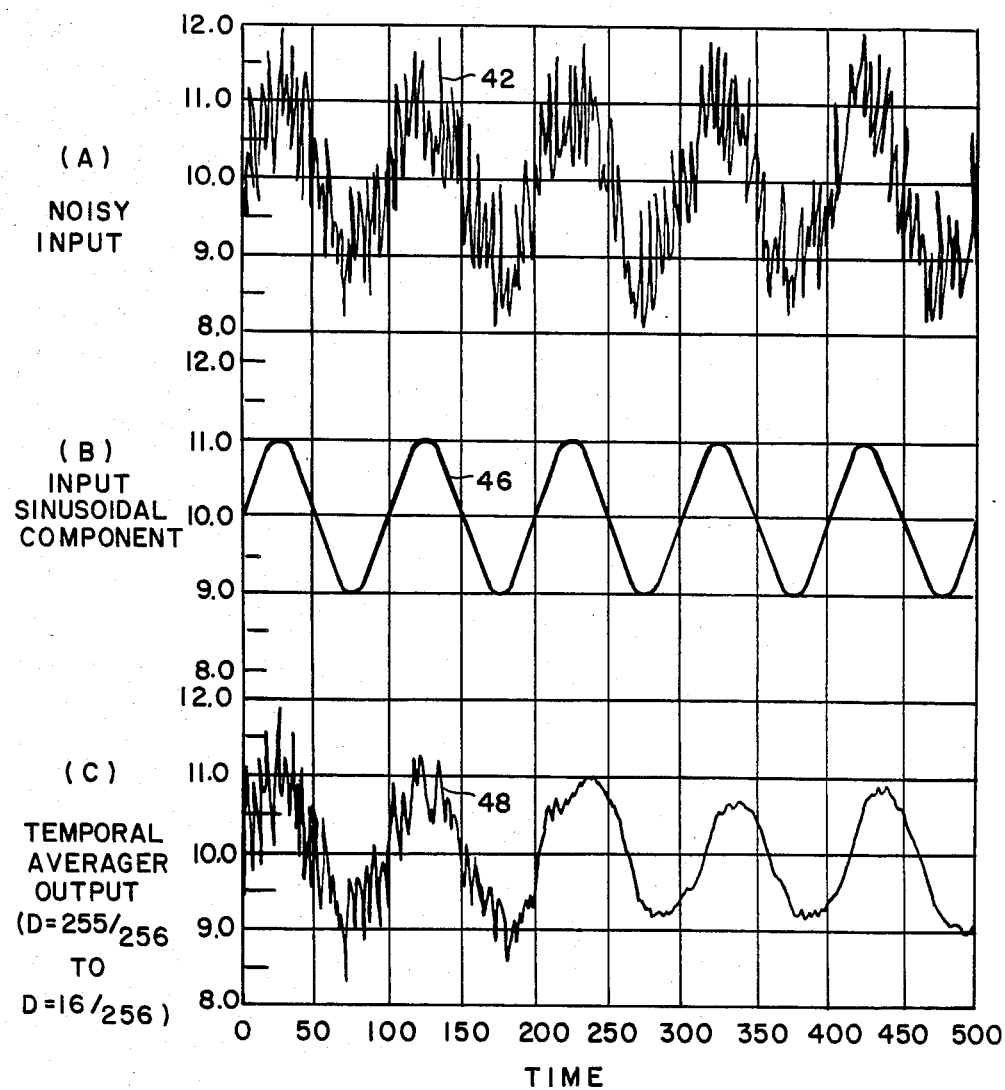
FIG. 10(A) is a graph of the amplitude of a noisy input signal to the temporal averager for use in connection with FIGS. 10(B) and 10(C), as a test signal.
FIG. 10(B) is a graph of the amplitude of the sinusoidal component of the noisy input signal of FIG. 10(A)
FIG. 10(C) is a graph of the output of the temporal averager responses to the noisy input of FIG. 10(A), as simulated for varying values of the digital code D, commencing with $D=255/256$ on the left and being changed in steps down to the value of D=16/256 on the right.

When used as a temporal averager, the DAC code D may be fixed, giving a fixed frequency response and exponential smoothing, or it may be varied linearly from 1 to the required value, giving a variable frequency response and linear smoothing. The family of curves 22 in FIG. 5 shows a simulation of the temporal averager's impulse response performance for a variety of different digital code values, D. FIGS. 6 and 7 show, respectively, in curves 24 and 26, the magnitude and phase of the frequency response of the temporal averager as a function of normalized frequency, using the digital code D as a parameter. The calculated value of the 3 dB frequency of the temporal averager of FIG. 4 is illustrated in curve 28 in FIG. 8, showing its dependence on the digital code, D. FIGS. 9 and 10 illustrate the performance of the temporal averager in improving signal-to-noise ratio. The input is presumed to be a sinusoid plus additive noise. Starting in FIG. 9(A), there is shown a graph of a noisy input waveform 32. The sinusoidal component of the waveform 32 is shown at 34 in FIG. 9(B). For such an input, a simulation of the temporal averager's performance shows an output as given at curve 36 in FIG. 9(C) when the digital code D is set to 16/256. FIGS. 10(A)–10(C) show a comparable simulation, except that the digital code D is varied in FIG. 10(C) from a high value of D=255/256 (almost 1) on the extreme left, at time 0, to D=16/256 at the center of curve 48, at time 250. Thus the signal-to-noise ratio (S/N) of the output waveform improves as the digital code is decreased from a maximum of 1 to the final fixed value 16/256.

Having thus described a specific embodiment of the invention and its mode of operation, it will be readily appreciated that various improvements, alterations and modifications thereto will be obvious and will readily occur to those skilled in the art. All such obvious improvements, alterations and modifications as fall within the spirit and scope of the invention are intended to be suggested by this disclosure. Accordingly, the foregoing description is intended to be exemplary only, and not limiting. The invention is intended to be limited only in accordance with the following claims which are appended hereto, and all equivalents thereto.

What is claimed is:

1. A temporal averaging circuit for supplying a filtered output from a noisy input signal applied to an input terminal thereof, comprising:
    a. first and second sample-and-hold circuits;
    b. a voltage-mode multiplying digital-to-analog converter (DAC) having an analog reference voltage input terminal, an analog ground terminal, an analog voltage output terminal and a digital code input port;
    c. each of the sample-and-hold circuits having an input terminal, an output terminal and a terminal for receiving a sampling signal;
    d. means for coupling a signal applied to the input terminal of the temporal averaging circuit from such input terminal to the input terminal of the first sample-and-hold circuit;
    e. the output terminal of the first sample-and-hold circuit being connected to the analog reference voltage input terminal of the DAC;
    f. the analog voltage output terminal of the DAC being connected to the input terminal of the second sample-and-hold circuit;
    g. the output terminal of the second sample-and-hold circuit being connected to the analog ground terminal of the DAC; and
    h. the filtered output of the circuit appearing at the analog output of the DAC.

2. The temporal averaging circuit of claim 1, wherein the gain of the DAC is controllable in response to the provision of a digital code to the digital code input port of the DAC.

3. A temporal averaging circuit for supplying a filtered output from a noisy input signal applied to an input terminal thereof, comprising:
    a. first and second sample-and-hold circuits;
    b. a voltage-mode multiplying digital-to-analog converter (DAC) having an analog reference voltage input terminal, an analog ground terminal, an analog voltage output terminal and a digital code input port;
    c. each of the sample-and-hold circuits having an input terminal, an output terminal and a terminal for receiving a sampling signal;
    d. means for coupling a signal applied to the input terminal of the temporal averaging circuit from such input terminal to the input terminal of the first sample-to-hold circuit;
    e. the output terminal of the first sample-and-hold circuit being connected to one of the analog reference voltage input terminal and the analog ground terminal of the DAC;
    f. the analog voltage output terminal of the DAC being connected to the input terminal of the second sample-and-hold circuit;
    g. the output terminal of the second sample-and-hold circuit being connected to the other of the analog reference voltage input terminal and the analog ground terminal of the DAC; and
    h. The filtered output of the circuit appearing at the analog output of the DAC.

4. The temporal averaging circuit of claim 3, wherein the gain of the DAC is controllable in response to the provision of a digital code to the digital code input port of the DAC.

* * * * *